(12) United States Patent
Fujiwara et al.

(10) Patent No.: US 9,284,164 B2
(45) Date of Patent: Mar. 15, 2016

(54) OVERHEAD TRANSPORT CARRIAGE

(75) Inventors: Yusuke Fujiwara, Ise (JP); Tatsuo Tsubaki, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 139 days.

(21) Appl. No.: 14/117,824

(22) PCT Filed: Mar. 2, 2012

(86) PCT No.: PCT/JP2012/055466
§ 371 (c)(1),
(2), (4) Date: Jan. 15, 2014

(87) PCT Pub. No.: WO2012/157319
PCT Pub. Date: Nov. 22, 2012

(65) Prior Publication Data
US 2014/0144859 A1    May 29, 2014

(30) Foreign Application Priority Data

May 17, 2011  (JP) ................ P2011-110330

(51) Int. Cl.
| | |
|---|---|
| *B61B 3/00* | (2006.01) |
| *B66C 21/00* | (2006.01) |
| *B66C 19/00* | (2006.01) |
| *H01L 21/677* | (2006.01) |

(52) U.S. Cl.
CPC ............ *B66C 19/00* (2013.01); *H01L 21/6773* (2013.01); *H01L 21/67733* (2013.01); *H01L 21/67736* (2013.01)

(58) Field of Classification Search
CPC ............ B61B 3/00; B61B 3/02; B61B 13/00; B61B 13/04; B61B 13/06; B66C 21/00; B66C 3/00; B66D 3/006; B66D 3/18; B66D 3/20; B66D 3/22

USPC ............ 104/89–91, 118, 120; 105/141, 148, 105/150, 156; 212/71, 328, 329
See application file for complete search history.

(56) References Cited

U.S. PATENT DOCUMENTS

2011/0062103 A1*  3/2011  Honda et al. .................... 212/71

FOREIGN PATENT DOCUMENTS

| EP | 1914179 A2 | 4/2008 |
|---|---|---|
| EP | 2277759 A1 | 1/2011 |
| WO | WO 2009/141976 A1 | 11/2009 |

OTHER PUBLICATIONS

Japanese language international search report dated Jun. 12, 2012 and its English language translation issued in corresponding PCT application PCT/JP2012/055466.
English translation of international preliminary report on patentability dated Nov. 21, 2013 issued in corresponding PCT application PCT/JP2012/055466.
Extended European search report dated Oct. 24, 2014 issued in corresponding European application 12786517.8.

* cited by examiner

*Primary Examiner* — R. J. McCarry, Jr.
(74) *Attorney, Agent, or Firm* — DLA Piper LLP (US)

(57) ABSTRACT

An overhead transport carriage 1 comprises a body 4 containing an object 30 and traveling along a traveling rail 3, a lifting mechanism 6 including a holding unit 8 holding the object 30 and a lifting unit 7 moving the unit 8 up and down with respect to a predetermined position P at which the object 30 is contained, an anti lid-dropping-off member 20 facing a lid 31 of the object 30 when the unit 8 is located at the position P, and a moving mechanism. The mechanism 10 moves the member 20 in response to the motion of the unit 8 so that the member 20 is located at an anti dropping-off position when the unit 8 is located at the position P, and the member 20 is located at the escape position when the unit 8 moves with respect to the position P.

8 Claims, 4 Drawing Sheets

OVERHEAD TRANSPORT CARRIAGE

CROSS REFERENCE TO RELATED APPLICATIONS

This application is a national stage of international application PCT/JP2012/055466, file on Mar. 2, 2012, and claims the benefit of priority under 3 USC 119 of Japanese application 2011-110330, file on May 17, 2011, which are incorporated herein by reference.

TECHNICAL FIELD

The present invention relates to an overhead transport carriage conveying an object to be conveyed (a cassette containing a plurality of semiconductor wafers, for example) with a detachable lid along a conveying route in, for example, a clean room.

BACKGROUND ART

A conventional overhead transport carriage, for example, described in Patent Literature 1 is known. In the overhead transport carriage of Patent Literature 1, an anti lid-dropping-off member prevents a lid from dropping off the object to be conveyed when the object to be conveyed is loaded and conveyed. The anti lid-dropping-off member is rotationally moved with an actuator so as to be placed ahead of the lid of the object to be conveyed when the object to be conveyed has been loaded, and escaped from the lid of the object to be conveyed when the object to be conveyed moves up and down.

CITATION LIST

Patent Literature

Patent Literature 1: WO2009/141976

SUMMARY OF INVENTION

Technical Problem

With the overhead transport carriage, the lid is prevented from dropping off when the object to be conveyed is conveyed, and the up-and-down motion of the object to be conveyed is prevented from being blocked. However, this requires a dedicated actuator to rotationally move the anti lid-dropping-off member. For this reason, in a relatively small overhead transport carriage, it is particularly required to simplify the structure thereof.

In light of the above, the present invention aims to provide an overhead transport carriage having a simple structure and preventing a lid forming a part of an object to be conveyed from dropping off when the object to be conveyed is conveyed, and preventing up-and-down motion of the object to be conveyed from being blocked when the object to be conveyed moves up and down.

Solution to Problem

An overhead transport carriage of the present invention, conveying an object to be conveyed with a detachable lid along a conveying route, comprises a body containing the object to be conveyed and traveling along the conveying route, a lifting mechanism including a holding unit holding the object to be conveyed and a lifting unit moving the holding unit up and down with respect to a predetermined position at which the object to be conveyed is contained, an anti lid-dropping-off member facing the lid when the holding unit is located at the predetermined position, and a moving mechanism moving the anti lid-dropping-off member in response to the up-and-down motion of the holding unit so that the anti lid-dropping-off member is located at a first position for preventing the lid from dropping off when the holding unit is located at the predetermined position and the anti lid-dropping-off member is located at a second position farther from the lid than the first position when the holding unit moves up and down with respect to the predetermined position.

In this overhead transport carriage, the anti lid-dropping-off member is located at the first position for preventing the lid from dropping off when the holding unit holding the object to be conveyed is located at the predetermined position. With this configuration, the lid is prevented from dropping off when the object to be conveyed is conveyed. The anti lid-dropping-off member is located at the second position farther from the lid than the first position when the holding unit holding the object to be conveyed is moved up and down with respect to the predetermined position. With this configuration, the up-and-down motion of the object to be conveyed is prevented from being blocked. In addition to the above, the moving mechanism moves the anti lid-dropping-off member between the first position and the second position in response to the up-and-down motion of the holding unit.

With this overhead transport carriage, therefore, the lid is prevented from dropping off when the object to be conveyed is conveyed and the up-and-down motion of the object to be conveyed is prevented from being blocked with a simple structure.

In the over head transport carriage of the present invention, the moving mechanism may include a first swinging unit provided with the anti lid-dropping-off member and swinging between a forward position and a backward position, and a second swinging unit connected to the first swinging unit and swinging between an upward position and a downward position, the second swinging unit may swing from the downward position to the upward position and the first swinging unit may swing from the backward position to the forward position when the holding unit moves up by a predetermined distance from the predetermined position, thereby moving the anti lid-dropping-off member from the second position to the first position, and the second swinging unit may swing from the upward position to the downward position and the first swinging unit may swing from the forward position to the backward position when the holding unit moves down by the predetermined distance, thereby moving the anti lid-dropping-off member from the first position to the second position. With this configuration, the structure of the moving mechanism is simplified and the reliability in the mechanical motion of the moving mechanism is improved.

In the over head transport carriage of the present invention, the moving mechanism may support the anti lid-dropping-off member so that the anti lid-dropping-off member displaces toward the second position by a predetermined amount when external force toward the second position acts on the anti lid-dropping-off member located at the first position, and the moving mechanism may include a displacement detector detecting displacement of the anti lid-dropping-off member toward the second position. With this configuration, the anti lid-dropping-off member located at the first position displaces toward the second position if the lid is about to drop off from the object to be conveyed during conveyance, for example. In this case, the displacement detector detects the displacement of the anti lid-dropping-off member toward the second position, thereby recognizing that the lid is about to drop off from the object to be conveyed. With this configuration, it is possible to take quick actions, such as suspending the travel of the overhead transport carriage if the lid is about drop off and interrupting the conveyance of the object to be conveyed for fixing the lid to the object to be conveyed.

In the overhead transport carriage of the present invention, a part of the anti lid-dropping-off member at least facing the lid may include a sheet member having flexibility. With this configuration, the anti lid-dropping-off member is prevented from protruding from the body when the anti lid-dropping-off member is installed. In addition, the lid is securely caught even if the lid drops off the object to be conveyed. Furthermore, the anti lid-dropping-off member deforms easily if the anti lid-dropping-off member contacts with an external device or other instruments, thereby preventing the external device or other instruments from being damaged.

Advantageous Effects of Invention

According to the present invention, an unsafe state in which the lid is about to drop off the object to be conveyed during conveyance is detected quickly, the lid is prevented from dropping off the object to be conveyed during conveyance, and the up-and-down motion of the object to be conveyed is prevented from being blocked with a simple structure.

DESCRIPTION OF EMBODIMENTS

The following describes a preferred embodiment of the present invention in detail with reference to the accompanying drawings. Note that, the same components are denoted by the same reference signs in each drawing, and redundant descriptions are omitted.

Figure 1:
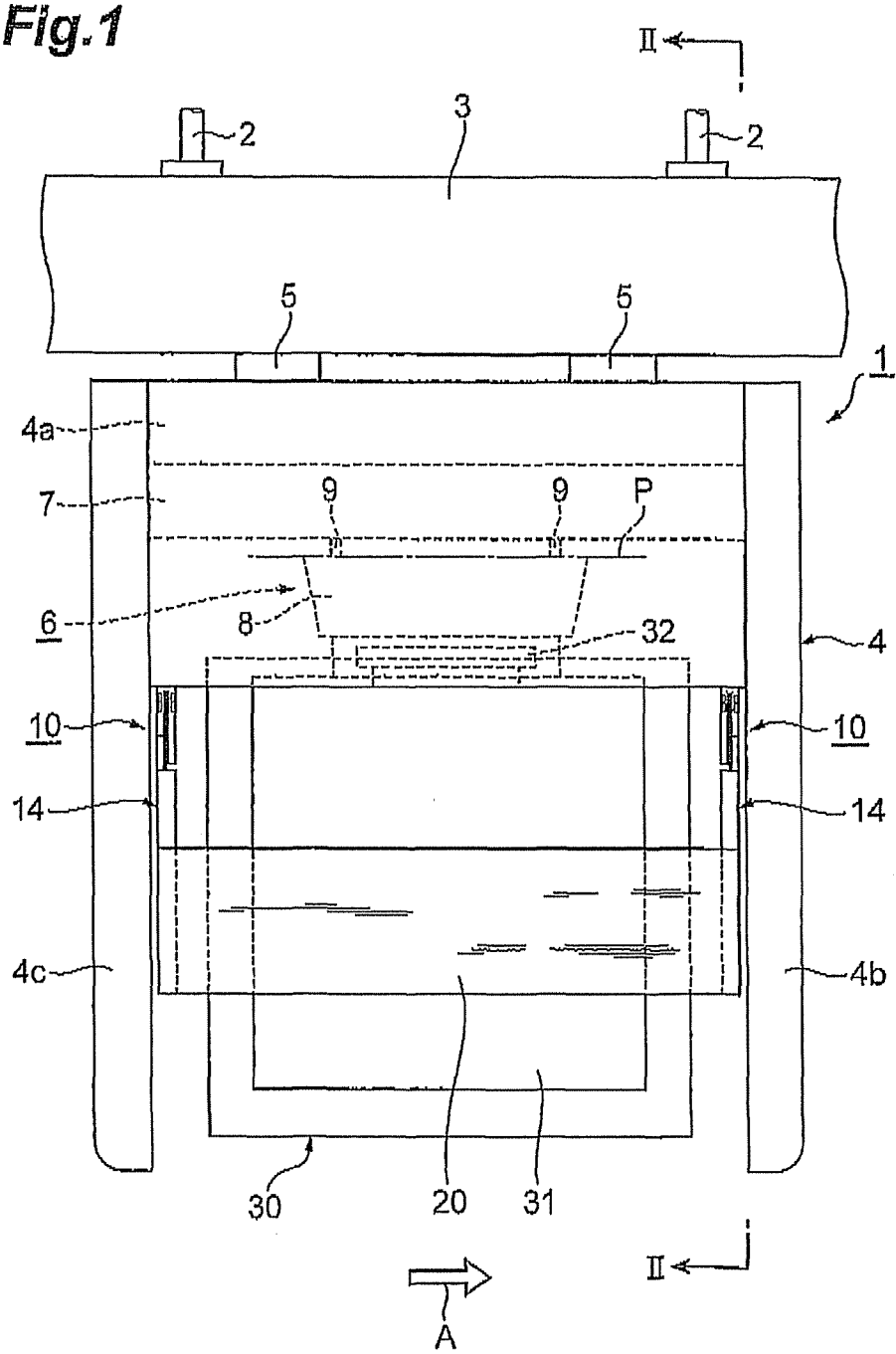
FIG. 1 is a side view of an overhead transport carriage of an embodiment of the present invention.

As illustrated in FIG. 1, this overhead transport carriage 1 conveys an object to be conveyed 30 along a traveling rail (conveying route) 3. The traveling rail 3 is mounted, via stays 2, on the ceiling of a clean room for manufacturing semiconductor devices. The object to be conveyed 30 is a cassette that contains a plurality of semiconductor wafers (what is called a FOUP (Front Opening Unified Pod)). A detachable lid 31 through which the semiconductor wafers are taken out and put in is attached to a side of the object to be conveyed 30. Furthermore, a flange 32 held with the overhead transport carriage 1 is provided to the top surface of the object to be conveyed 30.

The overhead transport carriage 1 includes a body 4 containing the object to be conveyed 30 and traveling along the traveling rail 3. The body 4 is suspended from the traveling rail 3 via traveling units 5. Each of the traveling units 5 includes a driving wheel and a guide wheel that contact with the inner surface of the traveling rail 3, thus the body 4 travels along the traveling rail 3. Furthermore, the traveling unit 5 includes an electromagnetic coil unit disposed on a part surrounded by the traveling rail 3, thereby receiving power, without contact, from a wire for high frequency current installed in the traveling rail 3.

The body 4 includes a base frame 4a on which the traveling unit 5 is mounted. The front side and the rear side of the base frame 4a in a conveying direction A are provided with a front frame 4b and a rear frame 4c extending downward, respectively. The object to be conveyed 30 is loaded between the front frame 4b and the rear frame 4c in a state that the lid 31 is directed in a lateral direction with respect to the conveying direction A. Note that, in the following description, a side that the lid 31 directs to is referred to as "one side", and the opposite side thereof is referred to as "the other side", with respect to the conveying direction A.

The base frame 4a is provided with a lifting mechanism 6. The lifting mechanism 6 includes a lifting unit 7 and a holding unit 8. The holding unit 8 holds the object to be conveyed 30 by holding the flange 32. The lifting unit 7 moves the holding unit 8 up and down with respect to a predetermined position P at which the containing of the object to be conveyed 30 is performed. More specifically, the lifting unit 7 sends out a plurality of belts 9 synchronously, thus the holding unit 8 attached to the ends of the belts 9 moves down from the position P. By contrast, the lifting unit 7 winds up the plurality of belts 9 synchronously, thus the holding unit 8 attached to the ends of the belts 9 moves up to the position P. The base frame 4a may be provided with a cross feeder displacing the lifting unit 7 to the one side or the other side with respect to the conveying direction A, and a θ drive rotating the lifting unit 7 in a horizontal plane, or other units.

With the above-mentioned configuration, the overhead transport carriage 1 works as follows: the overhead transport carriage 1 stops above a port of a conveyance source (for example, a semiconductor processing apparatus) to contain in the body 4, the object to be conveyed 30 placed on the port by lifting up the lifting mechanism 6. Subsequently, the overhead transport carriage 1 carries the object to be conveyed 30 along the traveling rail 3. Thereafter, the overhead transport carriage 1 stops above a port of the conveyance destination (for example, a semiconductor processing apparatus) to arrange the object to be conveyed 30 loaded in the body 4 on the port by moving down the lifting mechanism 6.

Figure 2:
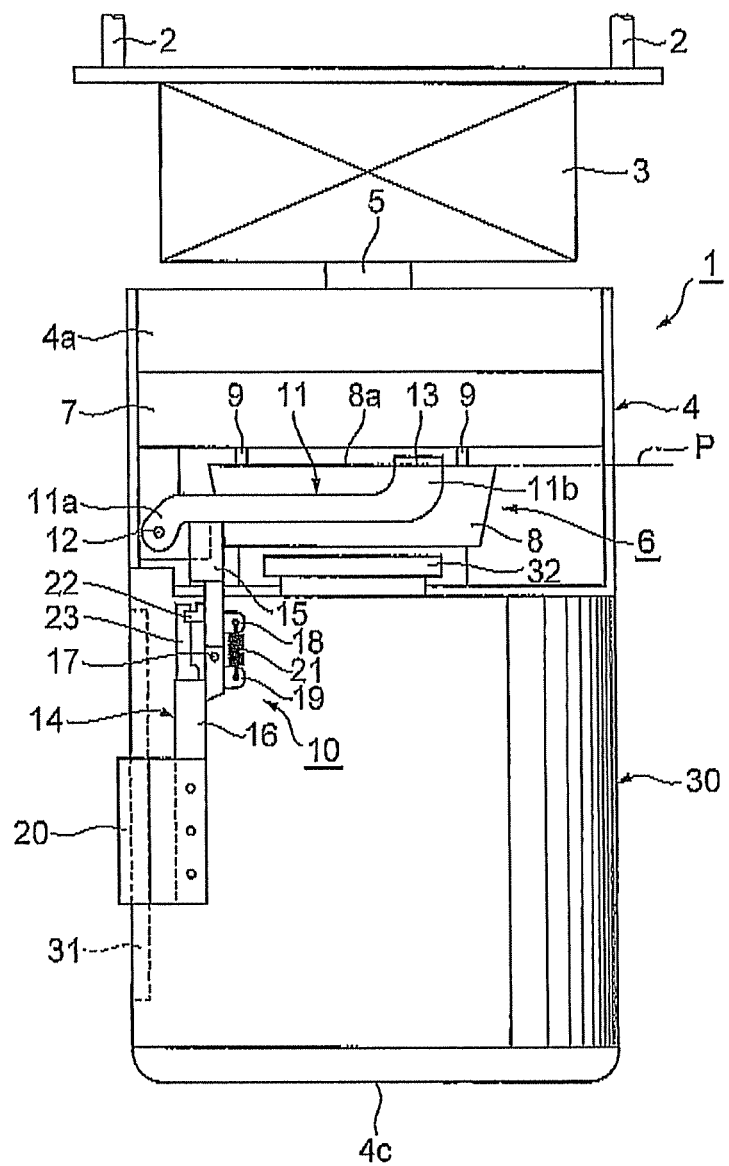
FIG. 2 is a sectional view of the overhead transport carriage taken along line II-II in FIG. 1.

As illustrated in FIG. 1 and FIG. 2, the overhead transport carriage 1 includes an anti lid-dropping-off member 20 facing the lid 31 of the object to be conveyed 30 when the holding unit 8 is located at the predetermined position P, and a moving mechanism 10 moving the anti lid-dropping-off member 20 in response to the up-and-down motion of the holding unit 8. The anti lid-dropping-off member 20 is a sheet member having flexibility (for example, thin fluorocarbon resins, such as Teflon that is a registered trademark) and is supported with the moving unit 10 along the conveying direction A so as to across the front of the lid 31.

The moving unit 10 includes a pair of swing arms (second swinging unit) 11 extending from the one side to the other side with respect to the conveying direction A. The pair of the swing arms 11 is installed between the frames 4b and 4c to sandwich therebetween the holding unit 8 arranged on the predetermined position P. One end 11a of each of the swing arms 11 is rotationally supported with a corresponding shaft 12 standing on the frame 4b or 4c. The other end 11b of each swing arm 11 is provided with a receiving part 13 extending toward the inside. The receiving parts 13 of the respective swing arms 11 abut on an upper surface 8a of the holding unit 8 when the holding unit 8 is located at the predetermined position P. The respective swing arms 11 swing about the shafts 12 between an upward position where the receiving part 13 is located at the position P and a downward position where the receiving part 13 is located lower than the position P. Note that when the holding unit 8 is located at the position P, the lower surface of the receiving part 13 and the upper surface 8a of the holding unit 8 are nearly located at the position P.

The one end 11a of each swing arm 11 is connected to another swing arm (first swinging unit) 14 extending downward. The respective swing arms 14 swing about the shafts 12 between a forward position where the swing arms 11 are located at the upward position and a backward position where the swing arms 11 are located at the downward position.

Both swing arms 14 are attached with the anti lid-dropping-off member 20. More specifically, with respect to the conveying direction A, both lateral ends of the anti lid-dropping-off member 20 are subjected to bending and are fixed to the respective swing arms 14. The anti lid-dropping-off member 20 swings about the shafts 12 between an anti dropping-off position (first position) where the swing arms 11 and 14 are located at the upward position and the forward position, respectively, and an escape position (second position) where the swing arms 11 and 14 are located at the downward position and the backward position, respectively. Note that the anti dropping-off position, at which a part of the anti lid-dropping-off member 20 facing the lid 31 is apart from the surface of the lid 31 with a distance of several millimeters, prevents the lid 31 from dropping off. The escape position is a position farther from the lid 31 than the anti dropping-off position.

Figure 3:
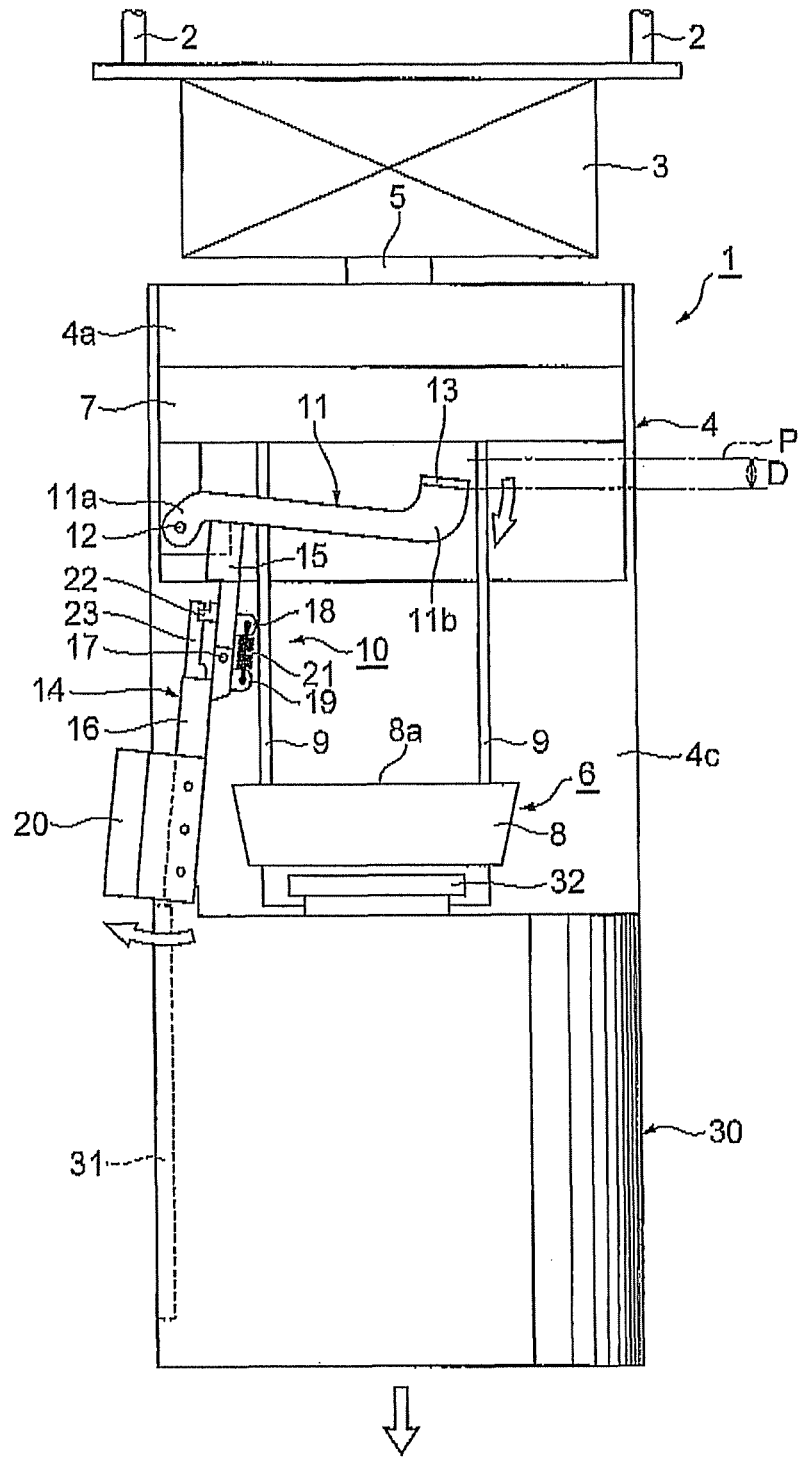
FIG. 3 is a view illustrating the up-and-down motion of an object to be conveyed in the overhead transport carriage in FIG. 2.

The moving mechanism 10 and the anti lid-dropping-off member 20 configured as above work as follows. In the case where the holding unit 8 moves down from the predetermined position P as illustrated in FIG. 2 and FIG. 3, the swing arms 14 reverse from the forward position to the backward position as the swing arms 11 move down from the upward position to the downward position due to the weight thereof if the holding unit 8 moves down from the position P by a predetermined distance D. With this configuration, the anti lid-dropping-off member 20 moves from the anti dropping-off position to the escape position. In other words, the swing arms 11 swing from the upward position to the downward position and the swing arms 14 swing from the forward position to the backward position when the holding unit 8 moves down by the predetermined distance D from the predetermined position P, thereby moving the anti lid-dropping-off member 20 from the anti dropping-off position to the escape position.

By contrast, in the case where the holding unit 8 moves up to the predetermined position P, the swing arms 14 move from the backward position to the forward position as the swing arms 11 move up from the downward position to the upward position because the holding unit 8 lifts the receiving part 13. With this configuration, the anti lid-dropping-off member 20 moves from the escape position to the anti dropping-off position. In other words, the swing arms 11 swing from the downward position to the upward position and the swing arms 14 swing from the backward position to the forward position when the holding unit 8 moves up by the predetermined distance D from the predetermined position P, thereby moving the anti lid-dropping-off member 20 from the escape position to the anti dropping-off position.

As mentioned above, the moving mechanism 10 moves the anti lid-dropping-off member 20 in response to the up-and-down motion of the holding unit 8 so that the anti lid-dropping-off member 20 is located at the anti dropping-off position when the holding unit 8 is located at the position P and the anti lid-dropping-off member 20 is located at the escape position when the holding unit 8 moves up and down with respect to the position P.

Figure 4:
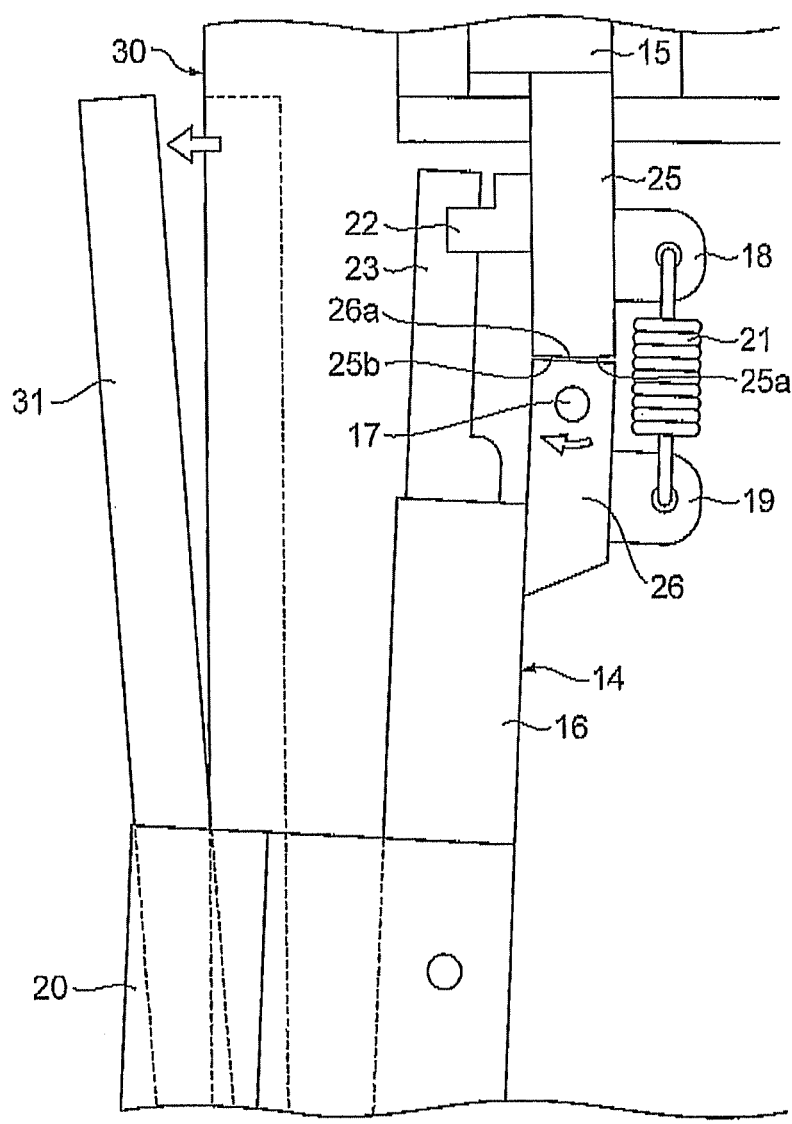
FIG. 4 is an enlarged view of a main part of the overhead transport carriage in FIG. 2.

Next, the swing arms 14 of the moving mechanism 10 are described in more detail. As illustrated in FIG. 4, each swing arm 14 includes a base-end part 15 connected to the one end 11a of each swing arm 11 and a tip-end part 16 fixed to the anti lid-dropping-off member 20. Such base-end parts 15 and tip-end parts 16 are rotationally connected through shafts 17. Note that the rotational range of the tip-end part 16 relative to the base-end part 15 is restricted with rotation restricting members 25 and 26.

Thus, the rotation restricting members 25 formed on the base-end parts 15 each are provided with end faces 25a and 25b having predetermined angles to form a convex toward the tip-end parts 16. The rotation restricting members 26 formed on the tip-end parts 16 are provided with end faces 26a so as to abut on the respective end faces 25a and 25b on the rotation restricting members 25 by rotational motion about the shafts 17. With this configuration, the tip-end parts 16 rotate with respect to the base-end parts 15 between the state where the end face 26a abuts on the end face 25a (the anti lid-dropping-off member 20 is arranged at the anti dropping-off position) and the state where the end face 26a abuts on the end face 25b (the anti lid-dropping-off member 20 is located at a position outer than the anti dropping-off position).

Brackets 18 and 19 are fixed to the base-end part 15 and the tip-end part 16, respectively. A pull spring 21 is stretched between the brackets 18 and 19. With this configuration, the tip-end part 16 is urged to the base-end part 15 so that the end face 26a comes into contact with the end face 25a. In addition to that, a displacement detector 22, such as a photo-interrupter having a light emitting element and a light receiving element, is fixed to the base-end part 15, and a light shielding plate 23 is fixed to the tip-end part 16. With this configuration, the light shielding plate 23 blocks a light path (the light path from the light emitting element to the light receiving element) when the tip-end part 16 rotationally moves with respect to the base-end part 15 so that the end face 26a comes into contact with the end face 25b.

As described above, the moving mechanism 10 supports the anti lid-dropping-off member 20 so that the anti lid-dropping-off member 20 displaces toward the escape position by a predetermined amount when external force toward the escape position acts on the anti lid-dropping-off member 20 located at the anti dropping-off position. In addition to that, the light path of the displacement detector 22 is blocked by the light shielding member 23 when the anti lid-dropping-off member 20 displaces toward the escape position by a predetermined amount, thereby detecting the displacement of the anti lid-dropping-off member 20 toward the escape position.

As described above, in the overhead transport carriage 1, the anti lid-dropping-off member 20 is located at the anti dropping-off position for preventing the lid 31 from dropping off when the holding unit 8 holding the object to be conveyed 30 is located at the predetermined position P. With this configuration, the lid 31 is prevented from dropping off the object to be conveyed 30 during conveyance. The anti lid-dropping-off member 20 is located at the escape position farther from the lid than the anti dropping-off position when the holding unit 8 holding the object to be conveyed 30 is moved up and down with respect to the predetermined position P. With this configuration, the up-and-down motion of the object to be conveyed 30 is prevented from being blocked. In addition to the above, the moving mechanism 10 moves the anti lid-dropping-off member 20 between the anti dropping-off position and the escape position in response to the up-and-down motion of the holding unit 8. With the overhead transport carriage 1, therefore, the lid 31 is prevented from dropping off when the object to be conveyed 30 is conveyed and the up-and-down motion of the object to be conveyed 30 is prevented from being blocked with a simple structure. Furthermore, a dedicated actuator or other devices to move the anti lid-dropping-off member 20 is not necessary, thus the power consumption in the overhead transport carriage 1 can be reduced.

In the overhead transport carriage 1, if the holding unit 8 does not hold the object to be conveyed 30, the anti lid-dropping-off member 20 is located at the anti dropping-off position when the holding unit 8 is located at the predetermined position P. With this configuration, the anti lid-dropping-off member 20 is prevented from contacting with an external device or other instruments when the overhead transport carriage 1 does not contain the object to be conveyed 30 and travels along the traveling rail 3 in an unloaded state. Moreover, the anti lid-dropping-off member 20 is located at the escape position as long as the holding unit 8 moves up and down with respect to the predetermined position P although the object to be conveyed 30 is not being held by the holding unit 8. With this configuration, the up-and-down motion of the holding unit 8 is prevented from being blocked when the holding unit 8 not holding the object to be conveyed 30 moves up and down.

The moving mechanism 10 includes the swing arms 11 and 14, thereby achieving the motion of the anti lid-dropping-off member 20 following the up-and-down motion of the holding unit 8. With this configuration, in the overhead transport carriage 1, the structure of the moving mechanism 10 is simplified and the reliability in the mechanical motion of the moving mechanism 10 is improved.

The moving mechanism 10 supports the anti lid-dropping-off member 20 so that the anti lid-dropping-off member 20 displaces toward the escape position by a predetermined amount when external force toward the escape position acts on the anti lid-dropping-off member 20 located at the anti dropping-off position. The moving mechanism 10 includes the displacement detector 22 detecting displacement of the anti lid-dropping-off member 20 toward the escape position. With this configuration, the anti lid-dropping-off member 20 located at the anti dropping-off position displaces toward the escape position if the lid 31 is about to drop off from the object to be conveyed 30 during conveyance, for example. In this case, the displacement detector 22 detects the displacement of the anti lid-dropping-off member 20 toward the escape position, thereby recognizing that the lid 31 is about to drop off from the object to be conveyed 30. With this configuration, it is possible to take quick actions, such as suspending the travel of the object to be conveyed 30 if the lid 31 is about to drop off and interrupting the conveyance of the object to be conveyed 30 for fixing the lid 31 to the object to be conveyed 30.

A part of the anti lid-dropping-off member 20 at least facing the lid 31 of the object to be conveyed 30 includes a sheet member having flexibility. With this configuration, the anti lid-dropping-off member 20 is prevented from protruding from the body 4 when the anti lid-dropping-off member 20 is installed. In addition, the lid 31 is securely caught even if the lid 31 drops off the object to be conveyed 30. Furthermore, the anti lid-dropping-off member 20 deforms easily if the lid dropping-off member 20 contacts with an external device or other instruments, thereby preventing the external device or other instruments from being damaged.

The present invention has been described above in detail based on an embodiment thereof. However, the present invention is not limited to the embodiment described above. For example, as long as the moving mechanism 10 moves the anti lid-dropping-off member 20 in response to the up-and-down motion of the holding unit 8 so that the anti lid-dropping-off member 20 is located at the anti dropping-off position (first position) when the holding unit 8 is located at the position P and the anti lid-dropping-off member 20 is located at the escape position (second position) when the holding unit 8 moves up and down with respect to the position P, the moving mechanism 10 is not limited to the configuration including the swing arms 11 and 14 and may include another link mechanism or other structure. One example of the moving mechanism 10 may cramp the anti lid-dropping-off member 20 including a sheet member to locate it at the anti dropping-off position and release the anti lid-dropping-off member 20 to locate it at the escape position.

The overhead transport carriage 1 is not limited to an apparatus that conveys the object to be conveyed 30 along the traveling rail 3 mounted in a clean room for manufacturing semiconductor devices. The object to be conveyed 30 is not limited to a cassette containing therein a plurality of semiconductor wafers. The materials and shapes of the overhead transport carriage 1 and the object to be conveyed 30 are not limited to the material and shape described above. Various kinds of materials and shapes can be applied to them.

INDUSTRIAL APPLICABILITY

According to the present invention, an unsafe state in which the lid is about to drop off the object to be conveyed during conveyance is detected quickly, the lid is prevented from dropping off the object to be conveyed during conveyance, and the up-and-down motion of the object to be conveyed is prevented from being blocked with a simple structure.

REFERENCE SIGNS LIST

1 . . . overhead transport carriage, 3 . . . traveling rail (conveying route), 4 . . . body, 6 . . . lifting mechanism, 7 . . . lifting unit, 8 . . . holding unit, 10 . . . moving mechanism, 11 . . . swing arm (second swinging unit), 14 . . . swing arm (first swinging unit), 20 . . . anti lid-dropping-off member, 22 . . . displacement detector, 30 . . . object to be conveyed, 31 . . . lid.

The invention claimed is:

1. An overhead transport carriage conveying an object to be conveyed with a detachable lid along a conveying route, the overhead transport carriage comprising:
   a body containing the object to be conveyed and traveling along the conveying route;
   a lifting mechanism including a holding unit holding the object to be conveyed and a lifting unit moving the holding unit up and down with respect to a predetermined position at which the object to be conveyed is contained;
   an anti lid-dropping-off member facing the lid when the holding unit is located at the predetermined position; and
   a moving mechanism moving the anti lid-dropping-off member in response to up-and-down motion of the holding unit so that the anti lid-dropping-off member is located at a first position for preventing the lid from dropping off when the holding unit is located at the predetermined position and the anti lid-dropping-off member is located at a second position farther from the lid than the first position when the holding unit moves up and down with respect to the predetermined position, wherein the moving mechanism includes a receiving part that is connected to the anti lid-dropping-off member and on which the holding unit abuts when the holding unit is located at the predetermined position, and by the abutment of the holding unit against the receiving part, the moving mechanism moves the anti lid-dropping-off member to the first position when the holding unit moves up to the predetermined position and lifts the receiving part, and moves the anti lid-dropping-off member to the second position when the holding unit moves down from the predetermined position and leaves the receiving part.

2. The overhead transport carriage according to claim 1, wherein the moving mechanism includes a first swinging unit provided with the anti lid-dropping-off member and swinging between a forward position and a backward position, and a second swinging unit connected to the first swinging unit and swinging between an upward position and a downward position, the second swinging unit swings from the downward position to the upward position and the first swinging unit swings from the backward position to the forward position when the holding unit moves up by a predetermined distance from the predetermined position, thereby moving the anti lid-dropping-off member from the second position to the first position, and the second swinging unit swings from the upward position to the downward position and the first swinging unit swings from the forward position to the backward position when the holding unit moves down by the predetermined distance, thereby moving the anti lid-dropping-off member from the first position to the second position.

3. The overhead transport carriage according to claim 1, wherein the moving mechanism supports the anti lid-dropping-off member so that the anti lid-dropping-off member displaces toward the second position by a predetermined amount when external force toward the second position acts on the anti lid-dropping-off member located at the first position, and the moving mechanism includes a displacement detector detecting displacement of the anti lid-dropping-off member toward the second position.

4. The overhead transport carriage according to claim 1, wherein a part of the anti lid-dropping-off member at least facing the lid includes a sheet member having flexibility.

5. The overhead transport carriage according to claim 2, wherein the moving mechanism supports the anti lid-dropping-off member so that the anti lid-dropping-off member displaces toward the second position by a predetermined amount when external force toward the second position acts on the anti lid-dropping-off member located at the first position, and the moving mechanism includes a displacement detector detecting displacement of the anti lid-dropping-off member toward the second position.

6. The overhead transport carriage according to claim 2, wherein a part of the anti lid-dropping-off member at least facing the lid includes a sheet member having flexibility.

7. The overhead transport carriage according to claim 3, wherein a part of the anti lid-dropping-off member at least facing the lid includes a sheet member having flexibility.

8. The overhead transport carriage according to claim 5, wherein a part of the anti lid-dropping-off member at least facing the lid includes a sheet member having flexibility.

* * * * *